(12) United States Patent
Schulz

(10) Patent No.: US 6,767,680 B2
(45) Date of Patent: Jul. 27, 2004

(54) SEMICONDUCTOR STRUCTURE AND METHOD FOR DETERMINING CRITICAL DIMENSIONS AND OVERLAY ERROR

(75) Inventor: Bernd Schulz, Radebeul (DE)

(73) Assignee: Advanced Micro Devices, Inc., Austin, TX (US)

(*) Notice: Subject to any disclaimer, the term of this patent is extended or adjusted under 35 U.S.C. 154(b) by 162 days.

(21) Appl. No.: 10/134,576

(22) Filed: Apr. 29, 2002

(65) Prior Publication Data

US 2003/0044702 A1 Mar. 6, 2003

(51) Int. Cl.[7] ................................................ G03F 9/00
(52) U.S. Cl. ........................... 430/30; 430/22; 356/400
(58) Field of Search ....................... 430/30, 22; 356/400

(56) References Cited

U.S. PATENT DOCUMENTS

| | | | |
|---|---|---|---|
| 5,216,257 A | 6/1993 | Brueck et al. | 250/548 |
| 5,622,796 A | 4/1997 | Canestrari et al. | 430/22 |
| 5,867,276 A | 2/1999 | McNeil et al. | 356/445 |
| 5,877,860 A | 3/1999 | Borden | 356/376 |
| 5,880,838 A | 3/1999 | Marx et al. | 356/351 |
| 6,051,348 A | 4/2000 | Marinaro et al. | 430/30 |
| 6,081,334 A | 6/2000 | Grimbergen et al. | 356/357 |
| 6,245,584 B1 | 6/2001 | Marinaro et al. | 438/14 |
| 6,433,878 B1 | 8/2002 | Niu et al. | 356/603 |
| 2002/0135781 A1 | 9/2002 | Singh et al. | 356/601 |

FOREIGN PATENT DOCUMENTS

| | | |
|---|---|---|
| DE | 199 25 831 A1 | 12/2000 |
| EP | 0 498 006 A1 | 8/1992 |
| JP | 57166034 A | 10/1982 |
| JP | 59004019 A | 1/1984 |
| JP | 08321532 A | 12/1996 |
| JP | 09033213 A | 2/1997 |
| JP | 11191530 A | 7/1999 |

OTHER PUBLICATIONS

Stein and Whitefield, "Integral Measurement of Micron Lines on Wafers, Masks and Layers by Using Diffraction," *IBM Technical Disclosure Bulletin*, vol. 24, No. 7A, pp. 3178–3180, Dec. 1981.

*Primary Examiner*—Christopher G. Young
(74) *Attorney, Agent, or Firm*—Williams, Morgan & Amerson, P.C.

(57) ABSTRACT

A semiconductor structure and a method of determining an overlay error produced during formation of a semiconductor structure is disclosed. The semiconductor structure comprises a first periodic pattern and a second periodic pattern, which overlap with each other, wherein a relative position between the overlapping first and second periodic patterns contains information on the magnitude and the sign of an overlay error in a predefined direction that has been caused during the formation of the first and second periodic patterns. The overlay error is determined by directing a light beam of known optical properties onto the first and second periodic patterns and by analyzing the diffracted beam by comparison with reference data. By providing two differently oriented diffracting areas, each comprising first and second periodic patterns, the overlay error in two dimensions can be determined.

11 Claims, 2 Drawing Sheets

SEMICONDUCTOR STRUCTURE AND METHOD FOR DETERMINING CRITICAL DIMENSIONS AND OVERLAY ERROR

BACKGROUND OF THE INVENTION

1. Field of the Invention

The present invention relates to the field of fabrication of integrated circuits, and, more particularly, to a semiconductor structure and a method for determining an overlay error caused during the formation of two subsequent material layers.

2. Description of the Related Art

Fabrication of integrated circuits requires tiny regions of precisely controlled size to be formed in a material layer of an appropriate substrate, such as a silicon substrate. These tiny regions of precisely controlled size are generated by treating the material layer by means of, for example, ion implantation or etching, wherein a mask layer is formed over the material layer to be treated to define these tiny regions. In general, a mask layer may consist of a layer of photoresist that is patterned by a lithographic process. During the lithographic process, the resist may be spin coated onto the wafer substrate, and is then selectively exposed to ultraviolet radiation. After developing the photoresist, depending on the type of resist, positive resist or negative resist, the exposed portions or the non-exposed portions are removed to form the required pattern in the photoresist layer. Since the dimensions of the patterns in modern integrated circuits are steadily decreasing, the equipment used for patterning device features have to meet very stringent requirements with regard to resolution of the involved fabrication processes. In this respect, resolution is considered as a measure specifying the consistent ability to print minimum-size images under conditions of predefined manufacturing variations. One dominant factor in improving the resolution is represented by the lithographic process, in which patterns contained in a photo mask or reticle are optically transferred to the substrate via an optical imaging system. Therefore, great efforts are made to steadily improve optical properties of the lithographic system, such as numerical aperture, depth of focus, and wavelength of the light source used.

The quality of the lithographic imagery is extremely important in creating very small feature sizes. Of comparable importance is, however, the accuracy with which an image can be positioned on the surface of the substrate. Integrated circuits are fabricated by sequentially patterning material layers, wherein features on successive material layers bear a spatial relationship to one another. Each pattern formed in a subsequent material layer has to be aligned to a corresponding pattern formed in the previous material layer within specified registration tolerances. These registration tolerances are caused by, for example, a variation of a photoresist image on the substrate due to non-uniformities in such parameters as resist thickness, baking temperature, exposure and development. Furthermore, non-uniformities in the etching processes can lead to variations of the etched features. In addition, there exists an uncertainty in overlaying the image of the pattern for the current material layer to the etched pattern of the previous material layer, while photolithographically transferring the image onto the substrate. Several factors contribute to the inability of the imagery system to perfectly overlay two layers, such as imperfections within a set of masks, temperature differences between times of exposure, and a limited registration capability of the alignment tool. As a result, the dominant criteria determining the minimum feature size finally obtained are resolution for creating features in individual wafer levels and the total overlay error to which the above-explained factors, in particular the lithographic processes, contribute.

Accordingly, it is essential to steadily monitor the resolution, i.e., the capability of reliably and reproducibly creating the minimum feature size, also referred to as critical dimension (CD), within a specific material layer, and to steadily determine the overlay accuracy of patterns of two subsequently formed material layers. Recently, scatterometry has become a powerful tool in characterizing a periodic pattern of features with a size in the range of 1 $\mu$m to 0.1 $\mu$m. In the scatterometry analysis, the substrate containing a periodic structure is illuminated with radiation of an appropriate wavelength range and the diffracted light is detected. Many types of apparatus may be used for illumination and detecting of the diffracted light beam. U.S. Pat. No. 5,867,276 describes a so-called two-$\theta$ scatterometer wherein the angle of incidence of a light beam is continuously varied by synchronously rotating the sample and the detector. Furthermore, this document describes a lens scatterometer system utilizing a rotating block to translate a light beam emitted from a light source to different points of the entrance aperture of a lens to illuminate the substrate at different angles of incidence. Moreover, this document describes a scatterometer with a fixed angle of incidence that utilizes a multi-wavelength illumination source to obtain the required information from the diffracted multi-wavelength beam. From this information contained in the measurement spectrum, the optical and dimensional properties of the individual elements that form the periodic structure and thickness of underlying films can be extracted, for example, by statistical techniques. The sample parameters of interest may include the width of lines, if the periodic pattern contains lines and spaces, their sidewall angle, and other structural details. In case of a more complex periodic structure having, for example, a two-dimensional periodicity, the parameters may include dimensional properties such as hole diameter or depth. It should be noted that in the present application the term "scatterometer" also includes devices emitting a substantially linearly polarized light beam such as an ellipsometer, to obtain structural information with respect to changes in the polarization state by detecting and analyzing the beam scattered from the periodic structure.

Although a scatterometer provides a powerful tool for a non-destructive and swift method for determining the quality of periodic structures formed in a material layer in conformity with semi-conductor fabrication processes, it is desirable to also determine the overlay accuracy by means of scatterometry.

SUMMARY OF THE INVENTION

In view of the above, the present invention provides a semiconductor structure for metrology of critical dimensions and overlay accuracy, wherein the semiconductor structure comprises a substrate having one or more material layers formed thereon and a first periodic pattern having a first periodicity along a predefined direction. The semiconductor structure further comprises a second periodic pattern having a second periodicity along the predefined direction, wherein the first and second periodic patterns are positioned to overlap with each other and a relative displacement of the first periodic pattern and the second periodic pattern is indicative of an overlay error of the first and second periodic patterns.

According to another aspect of the present invention, a method of determining an overlay error caused during formation of a semiconductor structure is provided, wherein the method comprises providing the semiconductor structure including the features as pointed out above, directing a light beam onto the first and second periodic patterns, and detecting a light beam scattered by the first and second periodic patterns to generate a measurement spectrum. The method further comprises comparing the measurement spectrum with reference data, wherein the reference data represents information for a predefined overlay error of the first and second periodic patterns with respect to a predefined direction.

In general, the first periodic pattern creates a diffracted light beam that includes information determined by the diffracting characteristics of the first periodic pattern, such as the distance of adjacent features, height or depth of the features, thickness of any overlying and underlying films, and the like. The second periodic pattern formed over and/or in the first periodic pattern represents a defined modification or a "disturbance" of the first periodic pattern to establish a common diffraction pattern. The precise relative position of the first and second periodic patterns is determined by the overlay error caused during formation of the first and second periodic patterns. Hence, the corresponding contribution of the defined modification or disturbance of the first periodic pattern to the total diffracted light beam depends on the relative position of the second pattern and therefore on the overlay error. By comparing the measured spectrum with reference data, information on the magnitude and the sign direction of the overlay error along the predefined direction may be obtained.

BRIEF DESCRIPTION OF THE DRAWINGS

The invention may be understood by reference to the following description taken in conjunction with the accompanying drawings, in which like reference numerals identify like elements, and in which.

Figure 1A:
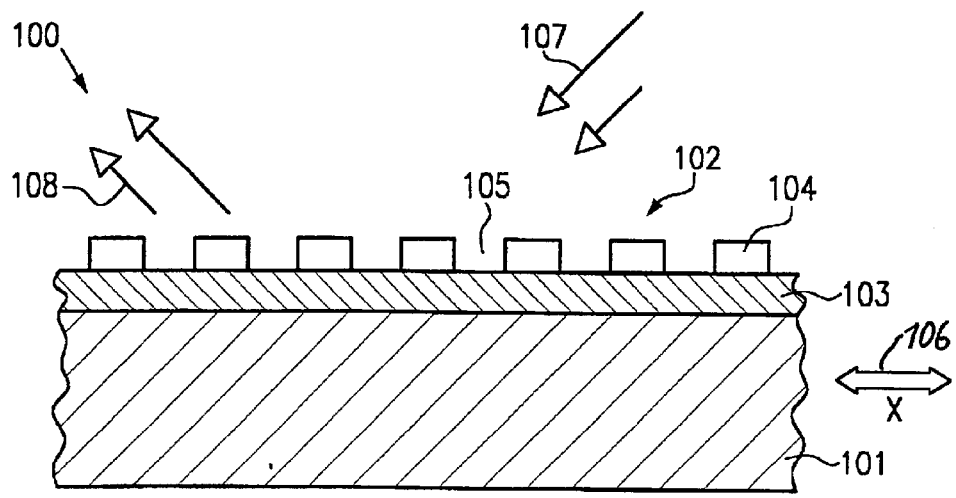
FIG. 1a shows a schematic top view and FIG. 1b shows a schematic side view, respectively, of a first and second periodic pattern in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1a is a schematic cross-sectional view of a semiconductor structure 100 to explain the basic concept of scatterometry. In FIG. 1a, a semiconductor structure 100 comprises a substrate 101 that may possibly include a plurality of different material layers in which features of an integrated circuit have been formed. For the sake of clarity, the substrate 101 is depicted as a single layer. A first periodic pattern 102 is located over the substrate 101, wherein the periodic pattern 102 comprises a thin film 103 and first regions 104 and second regions 105. In the example depicted in FIG. 1a, the first regions 104 represent lines extending orthogonally to the drawing plane of FIG. 1a and the second regions 105 represent spaces between the lines 104. The first and second regions 104, 105 define a first periodicity of the first periodic pattern 102 along a predefined direction X, indicated by arrow 106. An incident light beam, indicated by arrows 107, impinges on the periodic pattern 102 under a defined angle of incidence. The incident light beam 107 is characterized by known parameters such as polarization state, spectral distribution, and the like. A light beam indicated by arrows 108 leaves the substrate surface after having been diffracted by the first periodic pattern 102.

As previously explained, the diffractive characteristics of the first periodic pattern 102 sensitively depend on the properties of the first periodic pattern 102. For example, a variation of the thickness of the thin film 103, a variation of the optical properties of the thin film 103, such as a variation of the index of refraction due to a varying material composition, a varying dopant concentration and the like, a variation of the pitch of the periodic pattern 102, which is defined as the sum of the width of one of the first regions 104 and one of the second regions 105, a variation of the ratio of the width of the first and second regions 104 and 105, a variation of the height of the first regions 104 and/or a variation of the steepness of the sidewalls of the first regions 104, will significantly change the spectrum generated by the diffracted beam 108. Corresponding values for the parameters of the first periodic pattern 102 may be obtained by comparing the data obtained from the measured spectrum to corresponding reference data. The reference data may be obtained theoretically by modeling the semiconductor structure 100 taking into account the characteristics of the incident light beam 107, such as polarization state, angle of incidence, wavelength, and the like. By varying the parameters of the first periodic pattern 102, by calculation (using Maxwell's equations) and/or by experiment, the variation of the diffracted beam 108 can be estimated and compared to the actually-measured spectrum. The reference data may also be obtained only by experiment, for example, by preparing a plurality of test patterns using different parameter values. A correlation between the measured spectra and the actual parameter values may then be found by analyzing the corresponding test patterns by means of, for example, electron microscopy.

Figure 1B:
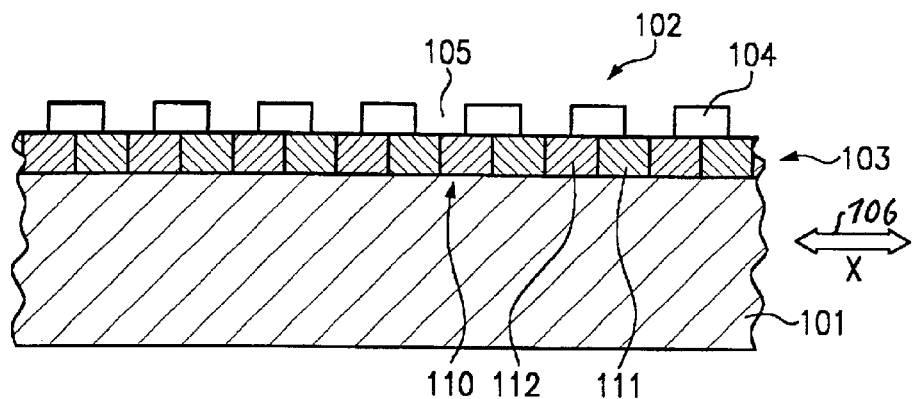

The present invention takes advantage of the fact that the diffracted beam 108 is strongly affected by a variation of the diffracting characteristics of the first periodic pattern 102. FIG. 1b schematically shows the semiconductor structure 100 of FIG. 1a, but with an additional second periodic pattern 110. The second periodic pattern 110 comprises in an alternating fashion first regions 111 and second regions 112, which are different from each other with respect to their optical characteristics. In the example of FIG. 1b, each of the first and second regions 104 and 105 of the first periodic pattern 102 overlaps with one of the first regions 111 and one of the second regions 112 of the second periodic pattern 110.

Typically, the second periodic pattern 110 may be formed by depositing one or more material layers 103 and patterning the material layer 103 by photolithography and corresponding subsequent processes. For example, openings may be formed in the material layer 103 by anisotropic etching and the openings may subsequently be filled with an appropriate material to form the first or second regions 111 and 112. Similarly, instead of forming openings by anisotropic etching, an ion implantation process may be employed to define the second periodic pattern 110. In a subsequent process, the first periodic pattern 102 may be formed by means of a further photolithographic step with or without additional process steps, such as etching and the like. Thus, the relative position of the first and second periodic patterns 102 and 110 represents a measure for an overlay error created by the formation of the second periodic pattern 110 and the subsequent formation of the first periodic pattern 102. In the fabrication of integrated circuits, typically an overlay error of about 20–40% of the critical dimensions of two adjacent or related levels in the semiconductor structure is assessed to be acceptable and represents one of the design rules for the semiconductor levels of interest. Thus, if the first and second periodic patterns 102 and 110 exhibit a periodicity along the X-direction with a pitch on the order of the respective critical dimension, a relative displacement of the first and second pattern to each other of about 20 to 40% of the critical dimension will entail a significant variation of the spectrum of the diffracted beam 108.

It should be noted that the arrangements depicted in FIG. 1b not only allow the determination of the magnitude of an overlay error, but at the same time allows the determination of the sign or direction of the overlay error. To clearly demonstrate the effect of the present invention, it is convenient to consider the first pattern 102 as a first grating and the second pattern 110 as a second grating in which, for example, the first regions 111 represent lines and the second regions 112 represent spaces. The first and second gratings overlap with each other to create a spatial phase difference. The variation of the spatial phase difference, caused by an overlay error during the formation of the first and second gratings, is then indicative for the overlay error. Preferably, the pitches of the first and second gratings are substantially equal so that the variation of the spatial phase difference, i.e., a change of the relative position of the first and second gratings, results in a variation of the diffracting characteristics in an increasing or decreasing manner, depending on the sign (–X direction, +X direction) of the change of the relative position. Accordingly, a shift of the first grating 102 in the positive X direction enlarges the spaces 112 of the second grating 110. On the other hand, a shift of the first grating 102 in the negative X direction decreases the spaces 112 (and of course enlarges the lines 111). Since the spectral intensity distribution of the diffracted beams depends upon the ratio of line width to space width, the measured spectrum contains information on the magnitude of displacement as well as on the sign as long as the maximum displacement is less than a minimum width of the regions 111, 112 and 104. The same is true for more complex periodic patterns in which properties other than the ratio of the width of the first and second regions are varied due to an overlay error. For example, the effective diameter of openings may vary in accordance with a relative shift of the periodic patterns.

Preferably, the first pattern 102 and the second pattern 110 are designed such that the overlap of region 104 with the region 111 and 112 is substantially equal for a zero overlay error. With this arrangement, a maximum overlay error of one half of the width of the region 104 can be detected. It is, however, possible to design an asymmetric arrangement should systematic deviations in particular process steps involved in forming the periodic patterns cause a systematic error of the overlay. It should be noted that the arrangement in accordance with the present invention also allows to simultaneously and individually monitor the diffracting characteristics of the periodic patterns 102 and 110. To this end the first and the second periodic patterns may comprise a portion without overlap so that either the diffracting characteristics of the first periodic pattern 102 or of the second periodic pattern 110 substantially determine the measured spectrum. Thus, the characteristics of features within a specified wafer level may be analyzed as is explained with reference to FIG. 11a. The patterns 102 and/or 110 may be formed in conformity with design requirements of features of critical dimensions that have been formed during the formation of the patterns 110 and 102. Hence, characteristics of circuit features may be estimated while at the same time the overlay error in the X-direction can be determined. For example, the first periodic pattern 102 may be formed of a photoresist pattern so as to only monitor the overlay accuracy of the lithographic apparatus and the photoresist processing equipment to optimize the lithography parameters by reworking corresponding wafers exhibiting an unacceptable overlay error. The formation of the first pattern 102 may also involve further processes such as anisotropic etching, implantation and the like, to estimate the total overlay error of the process sequence involved. Although the first periodic pattern 102 is depicted as grating having lines and spaces as the first and second regions 104, 105, the first and second regions 104, 105 can be formed of different materials, or the first and second regions 104, 105, both or individually, may comprise etched areas.

Figure 1C:
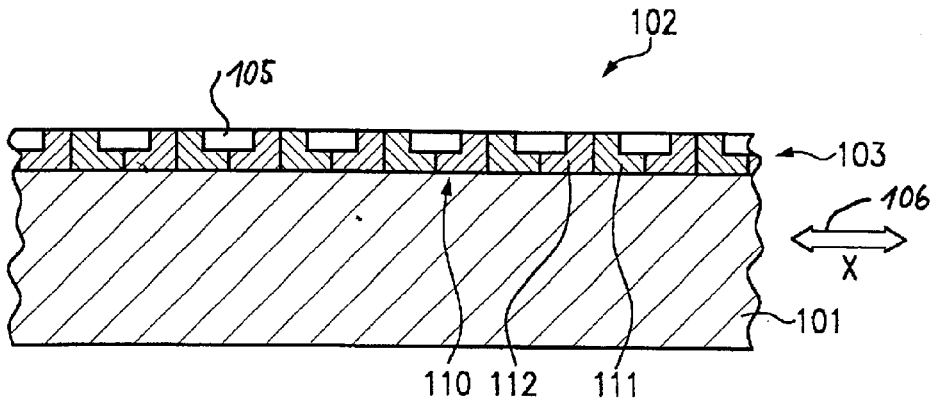
FIG. 1c depicts another alternative embodiment of the periodic patterns of the present invention.

FIG. 1c shows a schematic cross-sectional view of the semiconductor structure 100 of FIG. 1b, wherein the first periodic pattern 102 is formed by etching by employing, for example, the first regions 104 as an etch mask. Subsequently, the first regions 104 have been removed. The second regions 105 may then represent openings in the layer 103, wherein the depth of the openings 105 is adjusted in conformity with design requirements. Moreover, the openings 105 may be filled with an appropriate material, such as contact metal and the like.

Preferably, the X-direction indicated in the FIGS. 1a–c is approximately co-linear with one of the two linear movement directions used for aligning the substrate. This ensures that the overlay error in the X-direction determined by analyzing the diffracted beam is directly related to movement directions of process equipment such as step-and-repeat systems used in the photolithography.

The periodic patterns 102 and 110 may be formed in a portion of the chip area that is not available for circuit features. A corresponding portion of the substrate is, for example, the scribe lane separating adjacent chip areas and indicating the region where the substrate is cut after the final completion of the integrated circuit. Of course, if desired, the periodic patterns 102 and 110 may be formed in one or more of the production die formed above the substrate.

Figures 2A, 2B:
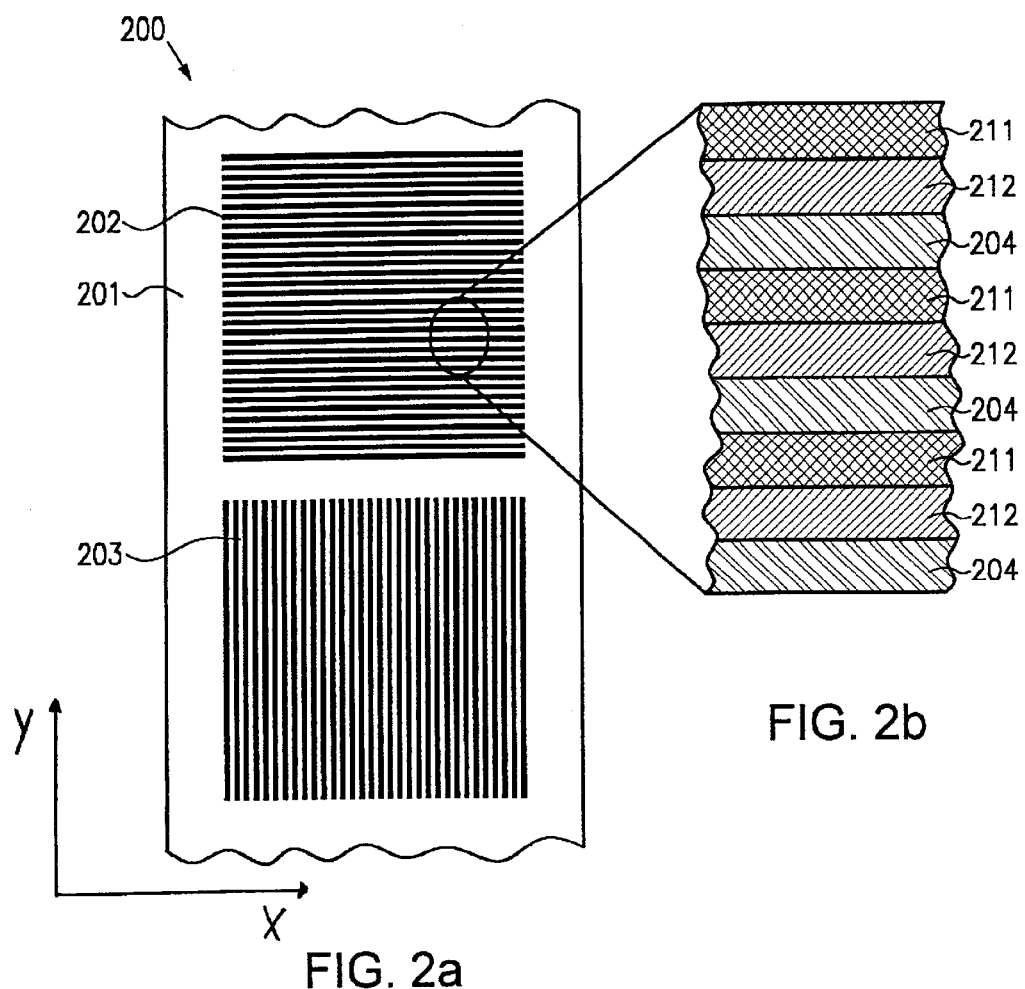
FIGS. 2a and 2b schematically show a periodic pattern for determining an overlay accuracy in two orthogonal directions (FIG. 2a) and an enlarged view of a portion of the pattern (FIG. 2b).

FIG. 2a shows a schematic top view including periodic patterns that are sensitive to the overlay displacement along the X-direction and along the Y-direction perpendicular to the X-direction. In FIG. 2a, a semiconductor structure 200 comprises a scribe lane 201 including a Y-overlay pattern 202 and a X-overlay pattern 203. The Y-overlay pattern 202 and the X-overlay pattern 203 may be formed in a substantially similar fashion and may exhibit similar diffracting characteristics except for the orientation of the periodicity. The overlay patterns 202 and 203 may, however, be different from each other with respect to, for example, grating pitch, height of features, angles of sidewalls and the like, to obtain additional information on different types of features employed in the circuit patterns.

FIG. 2b shows an enlarged view of the portion of the Y-overlay pattern 202. First regions 211 and second regions 212 formed in a common layer define a second periodic pattern and regions 204 formed on top of the regions 211 and 212 and partially overlapping with these regions define a first periodic pattern. This arrangement is merely illustrative and the overlay patterns 202 and 203 may also be formed in accordance with the criteria explained with reference to FIGS. 1b and 1c.

Although in FIGS. 2a and 2b only one pair of Y-overlay patterns and X-overlay patterns is depicted, it should be noted that a plurality of corresponding pairs of patterns may be formed along the scribe lanes enclosing a specific chip area. Plural pairs of overlay patterns allow the monitoring of the overlay error across the entire substrate surface so that any inhomogeneities of specific manufacturing processes can be detected. The size of the overlay patterns 202 and 203 is advantageously selected so that an incoming light beam can easily be centered onto the overlay patterns. Thus, a typical dimension of periodic patterns in the lateral dimension with respect to the scribe lane 201 is in the range from approximately 20–150 $\mu$m. Furthermore, it should be noted that although the regions 211 and 212, and the regions 111 and 112 of FIGS. 1b and 1c forming a second periodic pattern, and the regions 205 and 104 and 105 of FIGS. 1b and 1c forming a first periodic pattern, have been shown to exhibit substantially the same periodicity, i.e. the same pitch, the advantages of the present invention can still be obtained when the first and second periodicities are different from each other. Moreover, under certain circumstances it may be advantageous to provide, for example, only every second first region 204 in the embodiment shown in FIG. 2a, such that the first pattern in FIG. 2a is represented by isolated lines having a large distance to the adjacent line. A corresponding arrangement may be advantageously used in simultaneously determining an overlay error and characteristics of individual features, such as isolated lines.

A method of determining an overlay error caused during the formation of a semiconductor structure in accordance with the present invention may comprise the following steps. First, a semiconductor structure is provided having at least one area formed thereon which exhibits diffracting characteristics as pointed out above with reference to FIGS. 1 and 2. Next, a light beam is directed onto the at least one diffracting area, wherein advantageously the dimensions of the light spot on the diffracting area is smaller in size than the diffracting area to avoid edge effects and to facilitate central alignment of the light spot on the diffracting area. As previously explained, in one embodiment, a diffracting area is formed in one or more regions of the semiconductor structure where no additional chip area for circuit features is wasted. Thus, one location for the diffracting area is in the scribe lane. It, however, is within the scope of the present invention to provide the diffracting area at any arbitrary position that is deemed to be appropriate to obtain the required overlay information. In particular, periodic circuit features that form a first periodic pattern and a second periodic pattern created in a process sequence including overlay-sensitive process steps may be employed as a diffracting area in so far as these patterns are relatively positioned to each other to represent the magnitude and the direction of any overlay error. For example, a photoresist layer may be patterned on top of a periodic circuit structure, such as a memory chip. The photoresist layer may or may not, depending on design requirements, be removed after determining the overlay accuracy of the lithography process. The light beam directed on the diffracting area preferably includes a plurality of wavelengths and a defined polarization state, such as a light beam emitted by a spectroscopic ellipsometer as is well known in the art of semiconductor manufacturing. Instead of a multi-wavelength beam, a monochromatic beam may be used and the angle of incidence may be varied within a predefined range. As in the case of an ellipsometer, the incident light beam may be linearly polarized, for example by means of a polarizor, but a non-polarized light beam may be used as well. The term "light beam" is intended to include a broad range of wavelengths that is appropriate to analyze the diffracting characteristics of the diffracting area. Thus, the term "light beam" includes radiation of a wavelength from a few millimeters to a few nanometers.

The diffracted light beam is then detected by a suitable detector, such as one or more photodiodes or any other appropriate tool that is capable of detecting the intensity with respect to wavelength and/or angle of incidence. Furthermore, the detector may be adapted to detect the polarization state of the diffracted beam. The light source emitting the incident beam, the detector, and the diffracting area are positioned so as to define a plane of incidence, wherein advantageously the first and second periodic patterns of the diffracting area are periodic along a direction that is parallel to the plane of incidence. Preferably, this direction coincides with one of the translational movement directions used in aligning the substrate to obtain a maximum sensitivity along this direction.

After detecting the diffracted beam, the measured spectrum and/or information extracted therefrom is compared to a corresponding reference spectrum and/or to corresponding reference data to determine the diffracting characteristics of the diffracting area, including information about the magnitude and the direction, i.e. the sign, of the overlay error. As previously explained, the reference data and/or reference spectra may be derived from a theoretical model, experimental data and/or a combination thereof. Moreover, the reference spectrum and/or corresponding data may be stored in a library.

In one embodiment, two or more diffracting areas are provided on the substrate, wherein the orientations of two adjacent diffracting areas are substantially perpendicular to each other to obtain the magnitude and the sign of the overlay error in two orthogonal directions. Preferably, a plurality of pairs of diffracting areas, orthogonally oriented to each other, is provided across the substrate, for example at various locations in the scribe lanes, to determine the overlay accuracy across the entire substrate. The measurement may be performed in a sequential manner, i.e., one or more equally oriented diffraction areas are illuminated and the diffracted beam is then analyzed, and subsequently the one or more orthogonally oriented diffracting areas are measured by rotating the measurement apparatus and/or the incident and the diffracted light beam and/or the substrate. Alternatively, two adjacent diffracting areas may be measured simultaneously by providing a second incident light beam, wherein the detector is adapted to simultaneously analyze two diffracted beams.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of determining an overlay error caused during formation of a semiconductor structure, the method comprising:
    (a) providing the semiconductor structure comprising:
        a first periodic pattern; and
        a second periodic pattern, said first and second periodic patterns positioned to overlap one another, wherein a relative position between the first periodic pattern and the second periodic pattern is indicative for an overlay error caused during formation of the first and second periodic patterns;
    (b) directing a light beam onto the first and second periodic patterns;
    (c) detecting a light beam diffracted by the first and second periodic patterns to generate a measurement spectrum; and
    (d) comparing the measurement spectrum with reference data, wherein the reference data represents information for a predefined overlay error of the first and second periodic patterns with respect to a predefined direction.

2. The method of claim 1, wherein said light beam is a multi-wavelength light beam.

3. The method of claim 1, wherein said light beam is a substantially linearly polarized light beam.

4. The method of claim 1, wherein a plane of incidence of the light beam impinging on the first and second periodic patterns is selected to substantially coincide with the predefined direction.

5. The method of claim 1, wherein the semiconductor structure further comprises a third periodic pattern and a fourth periodic pattern, said third and fourth periodic patterns positioned to overlap one another, wherein a relative position of the third and fourth periodic patterns is indicative for an overlay error with respect to a second predefined direction.

6. The method of claim 5, wherein the predefined direction and the second predefined direction are substantially orthogonal to each other.

7. The method of claim 6, further comprising:
    (e) directing a second light beam onto the third and fourth periodic patterns;
    (f) detecting a light beam diffracted by the third and fourth periodic patterns to generate a second measurement spectrum; and
    (g) comparing the second measurement spectrum with reference data, wherein the reference data represents information for a predefined overlay error of the third and fourth periodic patterns with respect to the second predefined direction.

8. The method of claim 7, wherein the steps (b) to (d) and the steps (e) to (g) are performed substantially simultaneously.

9. The method of claim 7, wherein the steps (b) to (d) and the steps (e) to (g) are performed in a sequential manner.

10. The method of claim 9, wherein step (e) is performed by rotating the substrate.

11. The method of claim 9, wherein step (e) is performed by deflecting said light beam to create the second light beam.

* * * * *